United States Patent
Onaka et al.

(10) Patent No.: US 10,056,936 B2
(45) Date of Patent: Aug. 21, 2018

(54) FRONT END CIRCUIT AND COMMUNICATION APPARATUS

(71) Applicant: Murata Manufacturing Co., Ltd., Kyoto (JP)

(72) Inventors: Kengo Onaka, Kyoto (JP); Katsuhito Kuroda, Kyoto (JP); Yuki Nakaike, Kyoto (JP); Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/447,412

(22) Filed: Mar. 2, 2017

(65) Prior Publication Data

US 2017/0179998 A1  Jun. 22, 2017

Related U.S. Application Data

(63) Continuation of application No. PCT/JP2015/073469, filed on Aug. 21, 2015.

(30) Foreign Application Priority Data

Sep. 25, 2014 (JP) .................................. 2014-194956

(51) Int. Cl.
*H01P 1/213* (2006.01)
*H04B 1/52* (2015.01)
(Continued)

(52) U.S. Cl.
CPC ............... *H04B 1/52* (2013.01); *H01P 1/213* (2013.01); *H01P 1/383* (2013.01); *H03H 7/38* (2013.01);
(Continued)

(58) Field of Classification Search
CPC .................................. H04B 1/52; H01P 1/213
See application file for complete search history.

(56) References Cited

U.S. PATENT DOCUMENTS

| | | | |
|---|---|---|---|
| 5,701,595 A | 12/1997 | Green, Jr. | |
| 6,236,285 B1 * | 5/2001 | Konishi | H01P 1/387 333/1.1 |

(Continued)

FOREIGN PATENT DOCUMENTS

| | | |
|---|---|---|
| JP | H02-151130 A | 6/1990 |
| JP | H07-283615 A | 10/1995 |

(Continued)

OTHER PUBLICATIONS

Corrected version of Written Opinion of PCT/JP2015/073469 dated Nov. 10, 2015.

(Continued)

*Primary Examiner* — Tuan H Nguyen
(74) *Attorney, Agent, or Firm* — Pearne & Gordon LLP

(57) ABSTRACT

A front end circuit includes a circulator having a first port into which a transmission signal is input, a second port into/from which a transmission/reception signal is input/output, and a third port from which a reception signal is output. The impedance of the second port of the circulator is set to a value different from the impedance value of the first port and the third port. With his configuration, the narrowing of a frequency band and the increase in loss, which occur when an impedance matching circuit is additionally provided, are prevented.

15 Claims, 11 Drawing Sheets

(51) Int. Cl.
- *H01P 1/383* (2006.01)
- *H03H 7/38* (2006.01)
- *H04B 1/44* (2006.01)
- *H04B 1/48* (2006.01)
- *H04B 1/50* (2006.01)
- *H04W 4/80* (2018.01)
- *H04W 4/00* (2018.01)

(52) U.S. Cl.
CPC ............... *H04B 1/44* (2013.01); *H04B 1/48* (2013.01); *H04B 1/50* (2013.01); *H04W 4/008* (2013.01); *H04W 4/80* (2018.02)

(56) References Cited

U.S. PATENT DOCUMENTS

| | | | |
|---|---|---|---|
| 9,246,202 B1* | 1/2016 | Barker | H01P 1/38 |
| 2005/0287976 A1 | 12/2005 | Burgener et al. | |
| 2006/0270367 A1 | 11/2006 | Burgener et al. | |
| 2007/0216408 A1* | 9/2007 | Ando | G01R 29/0878 |
| | | | 324/258 |
| 2009/0309671 A1* | 12/2009 | Adams | H01P 1/387 |
| | | | 333/1.1 |
| 2014/0194074 A1* | 7/2014 | Klomsdorf | H04B 1/0458 |
| | | | 455/77 |

FOREIGN PATENT DOCUMENTS

| | | |
|---|---|---|
| JP | H08-307306 A | 11/1996 |
| JP | H09-069799 A | 3/1997 |
| JP | H09-219665 A | 8/1997 |
| JP | 2000-091814 A | 3/2000 |
| JP | 2003-234659 A | 8/2003 |
| JP | 2008-504745 A | 2/2008 |
| JP | 2008-193636 A | 8/2008 |
| WO | 2008048226 A2 | 4/2008 |

OTHER PUBLICATIONS

International Search Report for PCT/JP2015/073469 dated Nov. 10, 2015.
Corrected version of International Search Report for PCT/JP2015/073469 dated Nov. 10, 2015.
Office action issued in Japanese Application No. 2016-550036 dated Sep. 12, 2017.
Japanese Office Action for Application 2016-550036 dated Apr. 3, 2018.

* cited by examiner

FRONT END CIRCUIT AND COMMUNICATION APPARATUS

This is a continuation of International Application No. PCT/JP2015/073469 filed on Aug. 21, 2015 which claims priority from Japanese Patent Application No. 2014-194956 filed on Sep. 25, 2014. The contents of these applications are incorporated herein by reference in their entireties.

BACKGROUND

Technical Field

The present disclosure relates to a front end circuit that uses a circulator as an antenna duplexer and a communication apparatus including the front end circuit.

Patent Document 1 discloses a radio communication apparatus in which a circulator is placed between a transmitter and a receiver and a single antenna is shared between the transmitter and the receiver via the circulator. In the radio communication apparatus disclosed in Patent Document 1, a variable matching circuit is provided between an antenna port of the circulator and an antenna. This variable matching circuit performs impedance matching between the antenna and the circulator.

Patent Document 1: Japanese Unexamined Patent Application Publication No. 9-69799

BRIEF SUMMARY

In current years, antennas installed into small-sized mobile communication devices such as cellular phones are small irrespective of the wavelengths of frequency bands to be covered. The radiation resistance of such a small-sized antenna is low, and is less than 50Ω that is a standard in the field of communication equipment. In a case where such a small-sized antenna is connected to a 50Ω front end circuit, a matching circuit is therefore needed.

However, this matching circuit increases the losses of signals to be transmitted/received to/from an antenna and narrows the band of the antenna. In particular, in order to suppress the change in impedance of an antenna while performing antenna matching, a large-scale matching circuit including a variable capacitive element is needed as disclosed in Patent Document 1. In this case, a circuit size is further increased.

The present disclosure provides a front end circuit with which the narrowing of a frequency band and the complication of a circuit caused by an impedance matching circuit can be prevented and a communication apparatus including the front end circuit.

(1) A front end circuit according to the present disclosure includes a circulator having a first port into which a transmission signal is input, a second port into/from which a transmission/reception signal is input/output, and a third port from which a reception signal is output. An impedance of the second port of the circulator is set to a value different from an impedance value of the first port and the third port.

With the above-described configuration, the circulator can be used as an impedance transformer, and impedance matching between an antenna and a front end circuit can be performed without necessarily an impedance matching circuit.

(2) An impedance of the second port can be less than 50Ω. In this case, the front end circuit is applicable to a small-sized antenna having an impedance of less than 50Ω.

(3) A reactance element can be connected in series between the second port and an antenna connection port. In this case, the adjustment (switching) of a resonant frequency of the antenna can be performed.

(4) The circulator can include a first coil connected to the first port, a second coil connected to the second port, and a third coil connected to the third port. The number of turns of the second coil can be different from the number of turns of the first coil and the third coil. In this case, the impedance of the second port of the circulator can be easily made to be different from the impedance of the first port and the third port.

(5) The circulator can include a first coil connected to the first port, a second coil connected to the second port, and a third coil connected to the third port. A diameter of the second coil can be different from a diameter of the first coil and the third coil. In this case, the impedance of the second port of the circulator can be easily made to be different from the impedance of the first port and the third port.

(6) The circulator can include a first coil connected to the first port, a second coil connected to the second port, and a third coil connected to the third port. A conductor pattern width of the second coil can be different from a conductor pattern width of the first coil and the third coil. In this case, the impedance of the second port of the circulator can be easily made to be different from the impedance of the first port and the third port.

(7) The front end circuit can further include a transmission filter that is connected to the first port and is configured to pass a transmission signal and a reception filter that is connected to the third port and is configured to pass a reception signal. In this case, the isolation between a transmission circuit and a reception circuit can be further enhanced.

(8) The front end circuit can further include a high-band signal port into/from a high-band signal in a frequency band higher than a frequency band in which the transmission signal and the reception signal are present is input/output and a filter that is provided between the second port and the high-band signal port and is configured to pass the high-band signal. In this case, a high-band signal can be supported without necessarily affecting low-band performance.

(9) A communication apparatus according to the present disclosure includes the front end circuit according to any one of the above-described (1) to (8), an antenna connected to the front end circuit, and an RFIC connected to the front end circuit.

With the above-described configuration, impedance matching between an antenna and a front end circuit can be performed without necessarily an impedance matching circuit and a smaller communication apparatus can be provided.

According to the present disclosure, the impedance matching between a front end circuit and an antenna can be performed without necessarily an impedance matching circuit. As a result, a broadband antenna can be provided and the simplification of a circuit can be achieved. Furthermore, a smaller communication apparatus can be provided.

DESCRIPTION OF EMBODIMENTS

Figure 1:
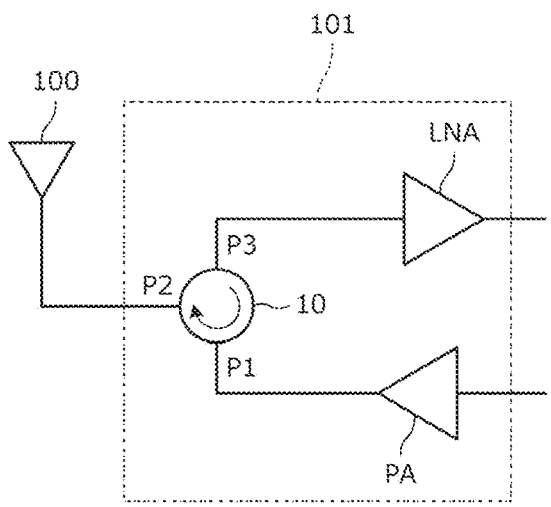
FIG. 1 is a circuit diagram of a front end circuit 101 according to a first embodiment of the present disclosure.

A plurality of embodiments for carrying out the present disclosure will be described below by giving some concrete examples with reference to the drawings. The same parts are denoted by the same reference symbols in the drawings. In the second and subsequent embodiments, descriptions of things that are common to the first embodiment will be omitted and only different points will be described. In particular, descriptions of similar operations and effects based on similar configurations will not be repeated in every embodiment.

First Embodiment

FIG. 1 is a circuit diagram of a front end circuit 101 according to the first embodiment of the present disclosure. The front end circuit 101 includes a circulator 10, a low-noise amplifier LNA, and a power amplifier PA. The power amplifier PA amplifies the power of a transmission signal. The low-noise amplifier LNA amplifies a reception signal. The circulator 10 has a first port P1 into which a transmission signal is input, a second port P2 into/from which a transmission/reception signal is input/output, and a third port P3 from which a reception signal is output. The power amplifier PA is connected to the first port P1 of the circulator 10. An antenna 100 is connected to the second port P2 of the circulator 10. The low-noise amplifier LNA is connected to the third port P3 of the circulator 10.

Figure 2:
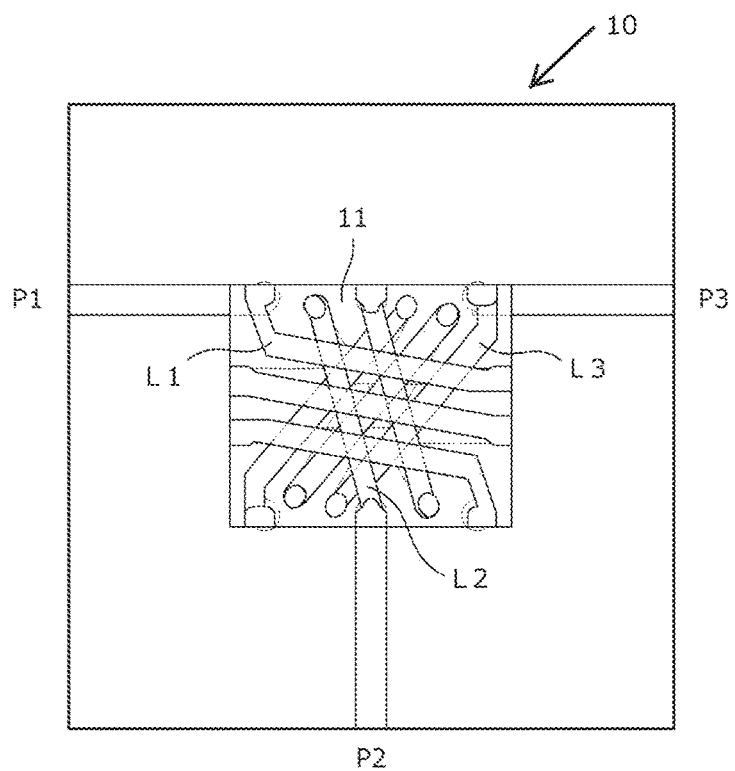
FIG. 2 is a plan view illustrating the internal structure of a circulator 10.

FIG. 2 is a plan view illustrating the internal structure of the circulator 10. The circulator 10 includes a ferrite plate 11, a first coil L1, a second coil L2, and a third coil L3 which are formed on the ferrite plate 11. These coils L1, L2, and L3 are formed of linear conductor patterns formed on the upper surface and undersurface of the ferrite plate 11 and conductor patterns formed on or near the side surface of the ferrite plate 11. The coils L1, L2, and L3 cross one another on the main surface of the ferrite plate. Although not illustrated in FIG. 2, the circulator 10 includes a magnet for applying a bias magnetic field to the ferrite plate 11.

One ends of the coils L1, L2, and L3 are connected to the ports P1, P2, and P3, respectively. The number of turns of the coil L1 connected to the first port P1 is approximately 2.5. The number of turns of the coil L2 connected to the second port P2 is approximately 1.5. The number of turns of the coil L3 connected to the third port P3 is approximately 2.5.

Figure 3:
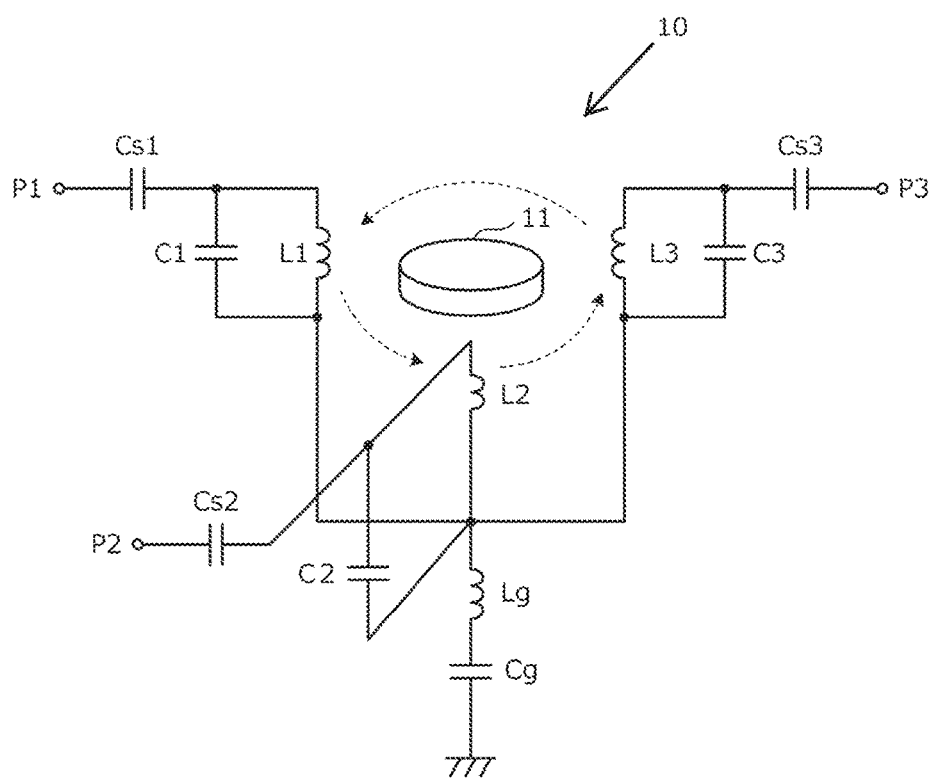
FIG. 3 is a circuit diagram of the circulator 10.

FIG. 3 is a circuit diagram of the circulator 10. A capacitor C1 is connected in parallel to the coil L1. A capacitor Cs1 is connected in series between one end of the coil L1 and the first port P1. A capacitor C2 is connected in parallel to the coil L2. A capacitor Cs2 is connected in series between one end of the coil L2 and the second port P2. A capacitor C3 is connected in parallel to the coil L3. A capacitor Cs3 is connected in series between one end of the coil L3 and the third port P3. The other ends of the coils L1, L2, and L3 are connected at a single common node. Between this common node and the ground, a series circuit including an inductor Lg and a capacitor Cg is inserted.

As illustrated in FIG. 2, the number of turns of the coil L2 connected to the second port is smaller than the number of turns of the coils L1 and L3 connected to the other ports. The capacitance of the capacitors C2 and Cs2 connected between the coil L2 and the second port P2 is therefore different from the capacitance of the capacitor C1, C3, Cs1, and Cs3 connected to the other ports. Thus, the impedance of the second port P2 of the circulator 10 is set to a value different from the impedance value of the first port P1 and the third port P3.

The setting of impedances may be performed on the basis of not only the numbers of turns of the coils L1, L2, and L3 but also the coil diameters (turn cross sections) of the coils L1, L2, and L3. For example, by making the coil diameter of the coil L2 smaller than the coil diameter of the coils L1 and L3, the impedance of the second port P2 of the circulator 10 is set to a value smaller than the impedance value of the first port P1 and the third port P3. Alternatively, the setting of impedances may be performed on the basis of the widths of a linear conductor pattern and a conductor pattern extending in the thickness direction of the ferrite plate. For example, by making the width of the conductor pattern of the coil L2 larger than the width of the conductor patterns of the coils L1 and L3, the impedance of the second port P2 of the circulator 10 is set to a value smaller than the impedance value of the first port P1 and the third port P3.

Figure 4A:
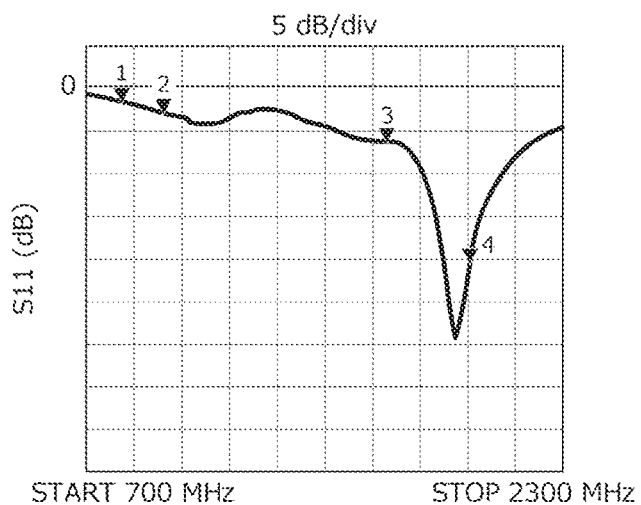
FIG. 4A is a diagram illustrating the frequency characteristics of a reflection coefficient (S (Scattering) parameter S11) of an antenna 100.
Figure 4B:
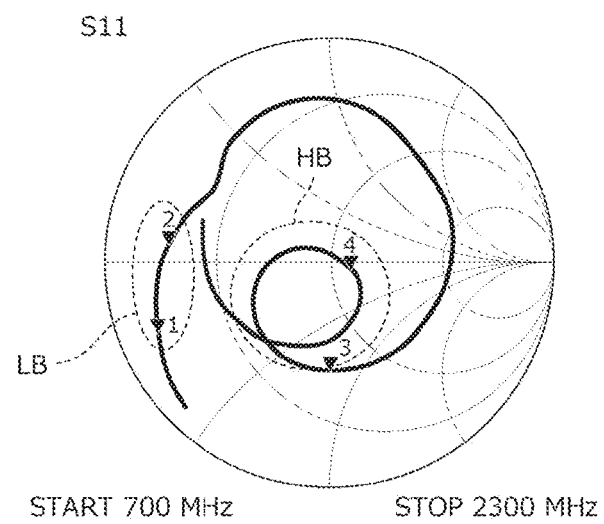
FIG. 4B is a Smith chart illustrating the frequency characteristics of a reflection coefficient of the antenna 100.

An exemplary impedance of an antenna connected to a front end circuit according to this embodiment (impedance obtained when the antenna 100 is viewed from the second port P2 of the circulator 10) will be illustrated. FIG. 4A is a diagram illustrating the frequency characteristics of a reflection coefficient (S (Scattering) parameter S11) of the antenna 100. FIG. 4B is a Smith chart illustrating the above-described frequency characteristics of the reflection coefficient.

Frequencies at respective points represented by markers 1, 2, 3, and 4 in FIGS. 4A and 4B are as follows.

Marker 1: 824 MHz
Marker 2: 960 MHz
Marker 3: 1710 MHz
Marker 4: 1990 MHz

Frequencies corresponding to the markers 1 and 2 are included in a low band, and frequencies corresponding to the markers 3 and 4 are included in a high band. Since a high-band locus HB illustrated in FIG. 4B is near the center (50Ω) of the Smith chart, matching is performed at 50Ω in the high band. On the other hand, a low-band locus LB is less than or equal to 10Ω. Accordingly, in a case where the antenna 100 is used as a low band antenna, a reflection coefficient is large. A front end circuit according to this embodiment causes the circulator 10 to perform impedance matching for an antenna having an impedance lower than an impedance (50Ω) of common high-frequency circuit systems.

The effect of impedance conversion performed by the circulator 10 will be described with reference to FIGS. 5 to 8.

Figure 5A:
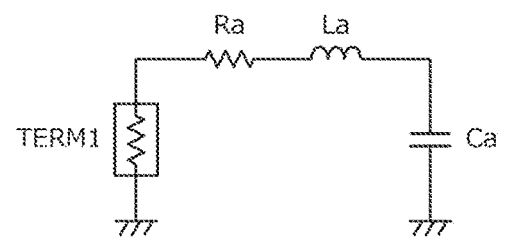
FIG. 5A is an equivalent circuit diagram of the antenna 100.
Figure 5B:
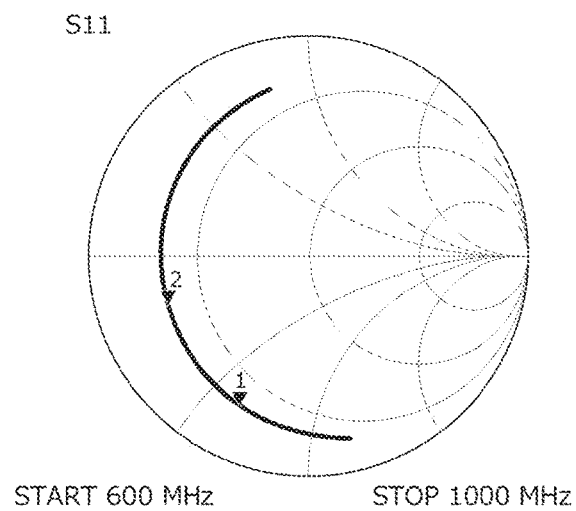
FIG. 5B is a Smith chart illustrating the frequency characteristics of a reflection coefficient of the antenna 100 represented by this equivalent circuit.

FIG. 5A is an equivalent circuit diagram of the antenna 100. FIG. 5B is a Smith chart illustrating the frequency characteristics of a reflection coefficient of the antenna 100 represented by this equivalent circuit. In FIG. 5B, a marker "1" indicates a position at 699 MHz and a marker "2" indicates a position at 787 MHz. Frequencies corresponding to the markers "1" and "2" are included in a low band. In FIG. 5A, a terminating resistor TERM1 represents an impedance at a feeding point for the antenna 100, a resistor Ra represents the addition of a radiation resistance and a loss resistance, an inductor La represents the inductance component of an antenna, and a capacitor Ca represents a capacitance component generated between the antenna and the ground. The values of respective circuit elements are as follows.

Ra: 10Ω
La: 19 nH
Ca: 2 pF
TERM1: (50+j0)Ω

Thus, since the antenna 100 includes a circuit in which reactance elements are connected in series, the impedance of the antenna 100 moves along an equi-resistance circle at the time of a frequency sweep as illustrated in FIG. 5B.

Figure 6A:
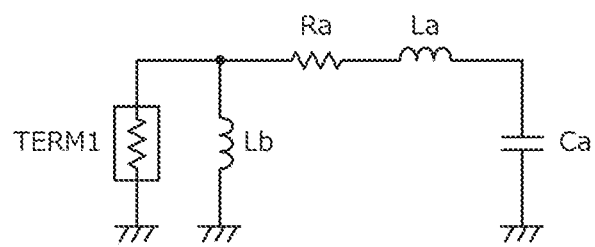
FIG. 6A is an equivalent circuit diagram illustrating a state where an inductor Lb is connected to the antenna 100.
Figure 6B:
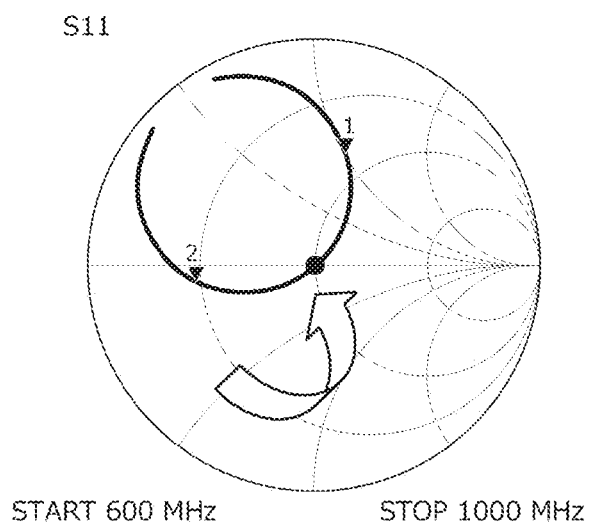
FIG. 6B is a Smith chart illustrating the frequency characteristics of a reflection coefficient in the state where the inductor Lb is connected to the antenna 100.

FIG. 6A is an equivalent circuit diagram illustrating a state where the inductor Lb is connected to the antenna 100. FIG. 6B is a Smith chart illustrating the frequency characteristics of a reflection coefficient in the state where the inductor Lb is connected to the antenna 100. In FIG. 6B, a marker "1" indicates a position at 699 MHz and a marker "2" indicates a position at 787 MHz. Thus, by connecting an inductor in parallel (shunt) to an antenna, an impedance locus roughly moves in an upward left direction (a quadrant of a complex reflection coefficient having a negative real part and a positive imaginary part) in a Smith chart and is converted into a small circle as compared with FIG. 5B. In a predetermined frequency band, an impedance locus passes around 50Ω. In this example, the value of Lb is 5.4 nH.

Figure 7A:
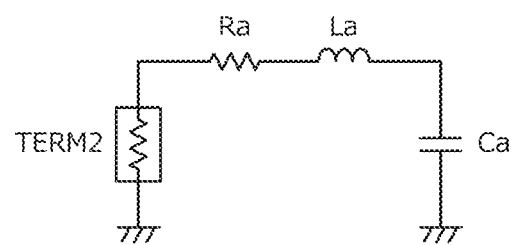
FIG. 7A is an equivalent circuit diagram of the antenna 100.
Figure 7B:
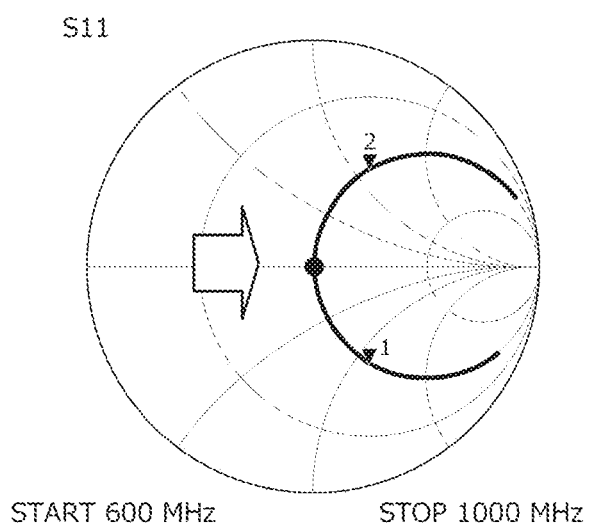
FIG. 7B is a Smith chart illustrating the frequency characteristics of a reflection coefficient of the antenna 100 represented by this equivalent circuit.

On the other hand, in this embodiment, the impedance of the second port P2 of the circulator 10 is set to a low value in accordance with the impedance of the antenna 100. FIG. 7A is an equivalent circuit diagram of the antenna 100 according to this embodiment. FIG. 7B is a Smith chart illustrating the frequency characteristics of a reflection coefficient of the antenna 100 represented by this equivalent circuit. In FIG. 7B, a marker "1" indicates a position at 699 MHz and a marker "2" indicates a position at 787 MHz. Frequencies corresponding to the markers "1" and "2" are included in a low band. In FIG. 7A, a terminating resistor TERM2 represents the impedance of the second port P2 of the circulator 10 connected to the antenna 100. The impedance of the second port P2 of the circulator 10 is determined so that it has the relation of complex conjugate with the impedance of the antenna. In this embodiment, at 742 MHz, the impedance represented by TERM2 is (10+j19.5)Ω and the impedance of the antenna is (10−j19.5)Ω. Thus, by performing conjugate matching between the second port of the circulator 10 and the antenna, an impedance locus roughly moves in a rightward direction along a constant reactance line in a Smith chart and is converted into a small circle. In FIG. 7B, the center of the Smith chart corresponds to a normalized impedance of (10+j19.5)Ω.

The above-described impedance locus movement is the same as the operation of an impedance transformer. In a case where a primary side impedance is represented by Z1 and a secondary side impedance is represented by Z2 in a transformer having a ratio between the numbers of turns of 1:n, impedance matching is performed at the time of $n^2|Z1|=|Z2|$. That is, an impedance transformer performs impedance conversion so that the square of the ratio between the numbers of turns is satisfied.

In a circulator, impedance conversion is also performed in accordance with a ratio between the numbers of turns. The impedance of a second port (antenna port) of a circulator is independent of the impedance of the first port (transmission port) and the third port (reception port) of the circulator. The circulator itself can therefore be used as an impedance transformer, and impedance matching between an antenna and a front end circuit can be performed without necessarily an impedance matching circuit.

Figure 8:
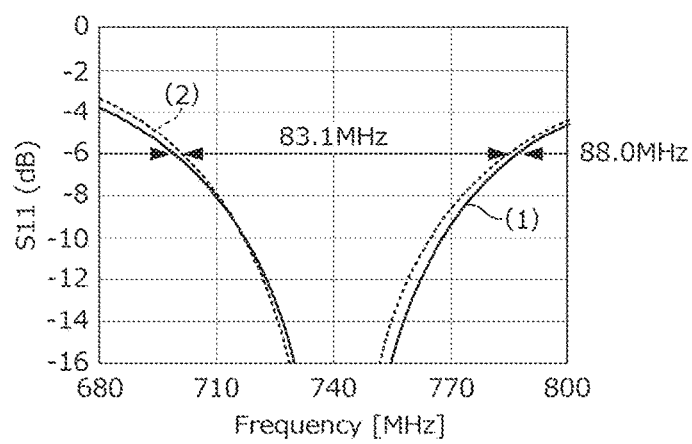
FIG. 8 is a diagram illustrating frequency characteristics (2) of a reflection coefficient of an antenna illustrated in FIG. 6A and frequency characteristics (1) of a reflection coefficient of an antenna illustrated in FIG. 7A.

FIG. 8 is a diagram illustrating frequency characteristics (2) of a reflection coefficient of an antenna illustrated in FIG. 6A and frequency characteristics (1) of a reflection coefficient of an antenna illustrated in FIG. 7A.

In the frequency characteristics (2) of a reflection coefficient of an antenna illustrated in FIG. 6A, the width of a band in which a voltage standing wave ratio (VSWR)<3 is satisfied is 83.1 MHz. In the frequency characteristics (1) of a reflection coefficient of an antenna illustrated in FIG. 7A, the width of a band in which VSWR<3 is satisfied is 88.0 MHz. A band broadening effect of approximately 6% can therefore be obtained.

As described above, according to this embodiment, the following effects can be obtained.

(1) Since an impedance matching circuit for making the impedance of the second port of the circulator conform to the impedance of the first and third ports of the circulator is not provided (there is no duplicate impedance matching circuit), the number of components can be reduced and the downsizing of a module can be achieved.

(2) Since, between an antenna and a circulator, there is no matching element that causes narrow-band frequency characteristics, a return loss can be reduced in a wide band. In a predetermined frequency band, VSWR can be further reduced.

(3) Since a matching element is not provided between an antenna and a front end circuit, an insertion loss can be reduced and the total passing loss of a circuit can be reduced.

Second Embodiment

Figure 9A:
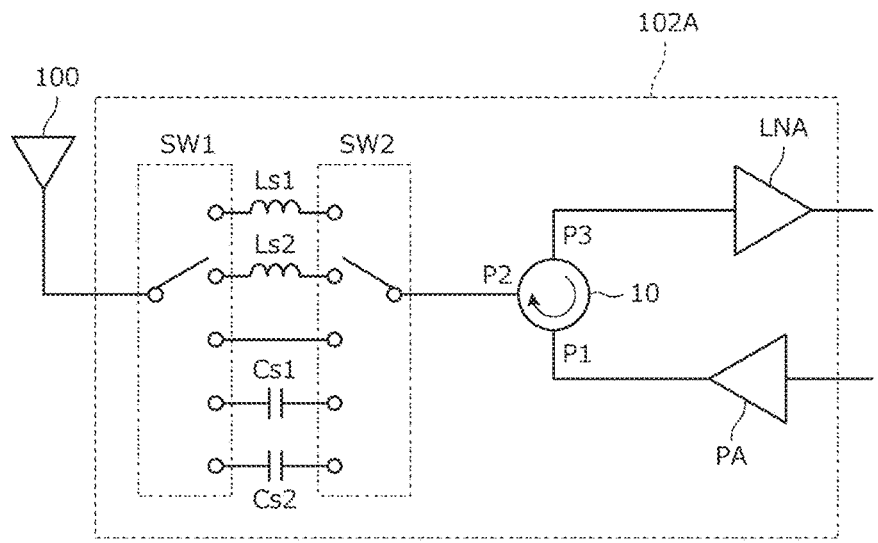
FIG. 9A is a circuit diagram of a front end circuit 102A according to a second embodiment of the present disclosure.
Figure 10A:
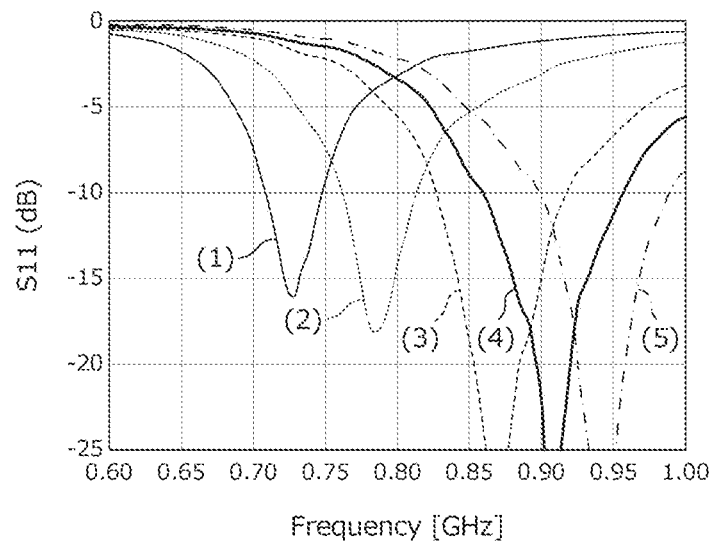
FIG. 10A is a diagram illustrating the frequency characteristics of a reflection coefficient when an antenna side is viewed from a second port P2 of the circulator 10.
Figure 10B:
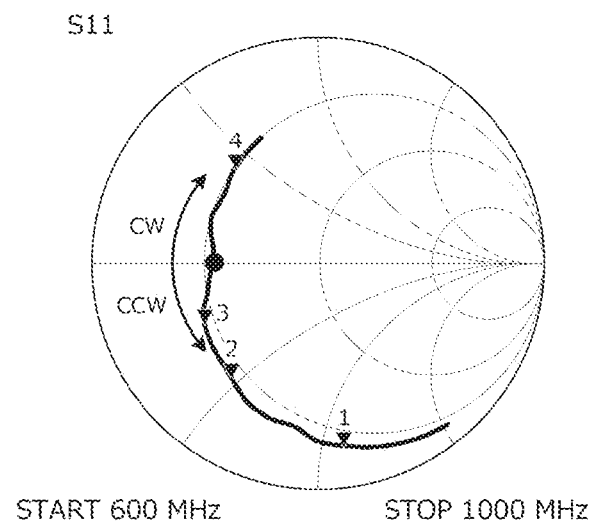
FIG. 10B is a Smith chart illustrating the frequency characteristics of a reflection coefficient.

FIG. 9A is a circuit diagram of a front end circuit 102A according to the second embodiment of the present disclosure. FIG. 10A is a diagram illustrating the frequency characteristics of a reflection coefficient when an antenna side is viewed from the second port P2 of the circulator 10. FIG. 10B is a Smith chart illustrating the frequency characteristics of a reflection coefficient.

An antenna installed in a small-sized communication apparatus usually changes from capacitive nature to inductive nature while having a low radiation resistance at the time of a frequency sweep as illustrated in FIG. 10B.

It is assumed that the impedance of the second port P2 of a circulator is set to the position (17.5Ω) of a circle. In a case where a reactance element is inserted in series with an antenna, the impedance moves in a direction represented by an arrow CW or CCW in FIG. 10B (the impedance changes). By selecting the reactance of the reactance element connected in series to the antenna as appropriate, the impedance locus of the antenna can therefore be set so that a predetermined frequency is located at or near the position of the circle.

When the palm or head of a user approaches an antenna, the impedance of the antenna changes because a capacitance component (the capacitor Ca) between the antenna and the ground increases. In order to suppress the change, the value of the reactance element connected in series to the antenna may be set.

Switches SW1 and SW2 illustrated in FIG. 9A select one of a plurality of reactance elements Ls1, Ls2, Cs1, and Cs2 or selects "direct connection".

The relationships between characteristics represented by (1) to (5) in FIG. 10A and the above-described reactance are as follows.

(1) 10 nH
(2) 5 nH
(3) 0Ω
(4) 20 pF
(5) 10 pF

Figure 9B:
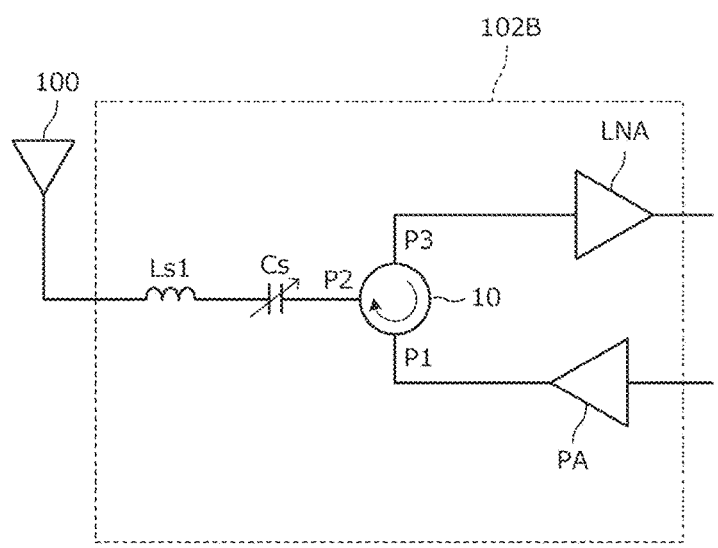
FIG. 9B is a circuit diagram of a front end circuit 102B according to the second embodiment.

FIG. 9B is a circuit diagram of a front end circuit 102B according to the second embodiment. In this example, a series resonance circuit including an inductor Ls1 and a variable capacitive element Cs is provided between a circulator and an antenna. Thus, a variable reactance element may be provided. Alternatively, a plurality of reactance elements may be connected in series.

Thus, each of the front end circuits 102A and 102B according to this embodiment operates as a front end circuit that is tunable in a wide band.

A reactance element does not necessarily have to be inserted between an antenna and a circulator, and may be inserted in series at some midpoint of the radiation electrode of an antenna.

According to this embodiment, since a matching circuit connected to an antenna does not include parallel-connected reactance elements, the number of elements is small and a low loss property can be maintained.

Third Embodiment

Figure 11:
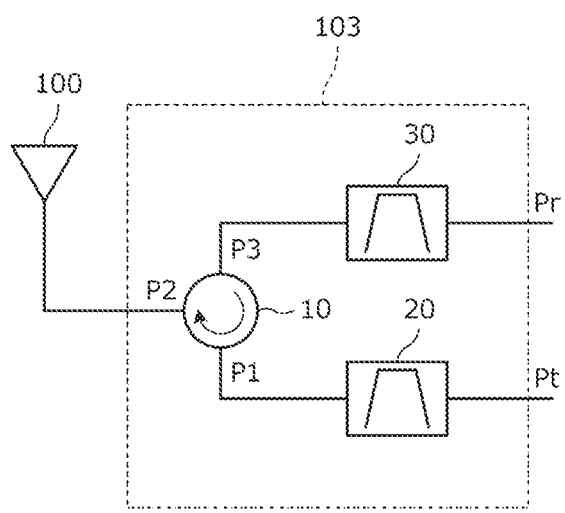
FIG. 11 is a circuit diagram of a front end circuit 103 according to a third embodiment of the present disclosure.

FIG. 11 is a circuit diagram of a front end circuit 103 according to the third embodiment of the present disclosure. The front end circuit 103 includes the circulator 10, a transmission filter 20, and a reception filter 30. The transmission filter 20 passes a transmission signal and blocks a reception signal. The reception filter 30 passes a reception signal and blocks a transmission signal. The transmission filter 20 is connected to the first port P1 of the circulator 10 and a transmission signal input port Pt. The reception filter 30 is connected between the third port P3 of the circulator 10 and a reception signal output port Pr.

Figure 12:
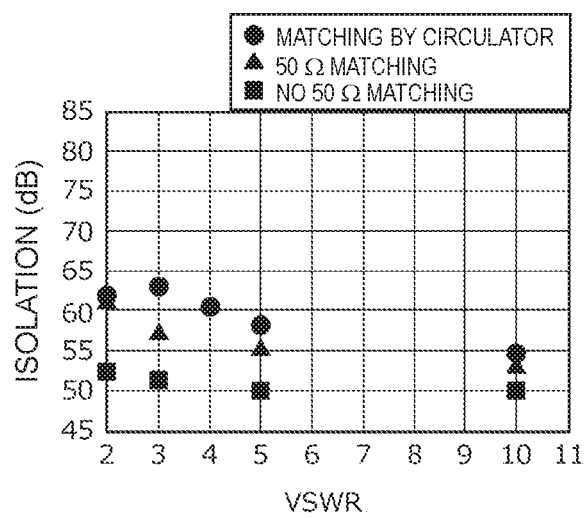
FIG. 12 is a diagram illustrating isolation characteristics of the front end circuit 103.

FIG. 12 is a diagram illustrating isolation characteristics of the front end circuit 103. In FIG. 12, a horizontal axis represents an antenna VSWR and a vertical axis represents the amount of isolation (dB). This drawing illustrates characteristics in a high band (1710 to 1785 MHz).

In FIG. 12, (1) represents the characteristics of a front end circuit according to this embodiment, (2) represents the characteristics of a front end circuit in which a matching circuit for 50Ω matching is connected between a circulator having a port impedance of 50Ω and an antenna, and (3) represents the characteristics of a front end circuit in which a matching circuit is not connected between a circulator having a port impedance of 50Ω and an antenna.

According to this embodiment, as compared with a front end circuit in the related art, isolation can be enhanced when an antenna VSWR is greater than or equal to 2.

Fourth Embodiment

Figure 13:
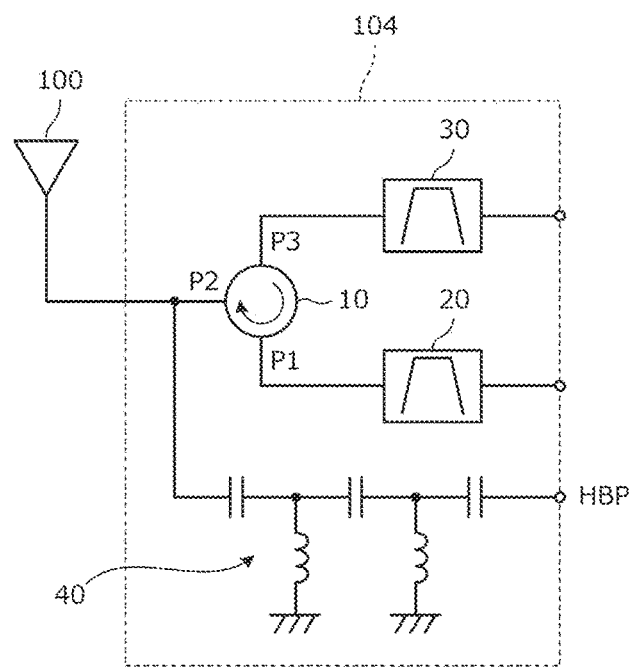
FIG. 13 is a circuit diagram of a front end circuit 104 according to a fourth embodiment of the present disclosure.

FIG. 13 is a circuit diagram of a front end circuit 104 according to the fourth embodiment of the present disclosure. The front end circuit 104 includes the circulator 10, the transmission filter 20, the reception filter 30, and a high pass filter 40. A circuit including the circulator 10, the transmission filter 20, and the reception filter 30 is used to transmit/receive a low-band signal. The high pass filter 40 is used to transmit/receive a high-band signal. The antenna 100 has a single feeding point and supports a high band and a low band.

The high pass filter 40 is provided between a high-band signal port HBP into/from which a high-band signal is input/output and the second port P2 of the circulator 10.

The circulator 10 can provide a broadband impedance with virtually no frequency characteristics in a low band. A high-band signal that cannot be supported by the circulator 10 is input/output into/from a circuit for a high band via the high pass filter 40 and the high-band signal port HBP.

According to this embodiment, when the impedance of the second port P2 of the circulator 10 is high in a high band, high-band performance can be realized without necessarily affecting low-band performance.

Fifth Embodiment

An example of a communication apparatus according to the fifth embodiment will be described.

Figure 14:
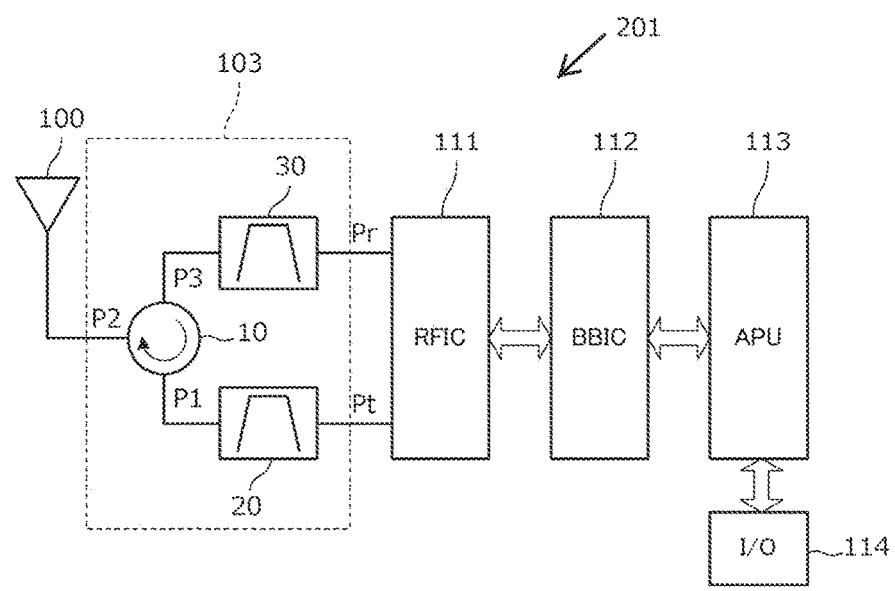
FIG. 14 is a block diagram of a communication apparatus according to a fifth embodiment of the present disclosure.

FIG. 14 is a block diagram of a communication apparatus 201 according to the fifth embodiment. The communication apparatus 201 includes the front end circuit 103, the antenna 100, an RFIC 111, a baseband IC 112, an application processor 113, and an I/O device 114.

The antenna 100 is, for example, a monopole antenna, an inverted L-type antenna, or an inverted F-type antenna which supports a low band and a high band. The front end circuit 103 has already been described in the third embodiment. The RFIC 111 is a high-frequency integrated circuit, and includes a modulation circuit, a demodulation circuit, etc. The baseband IC 112 performs encoding, decoding, and other pieces of signal processing upon a baseband signal. The application processor 113 performs data processing such as multimedia processing other than communications and calls. The I/O device 114 is, for example, a touch panel or a display device. The application processor 113 is used to input/output data into/from the I/O device 114.

The above-described components are enclosed in a single housing. For example, the front end circuit 103, the RFIC 111, the baseband IC 112, and the application processor 113 are disposed on a printed wiring board, and the printed wiring board is enclosed in the housing. The I/O device 114 is incorporated into the housing. The antenna 100 is disposed on the printed wiring board or is placed on the inner surface of the housing or inside the housing.

With the above-described configuration, a small-sized communication terminal that performs antenna matching in a wide band can be obtained.

The descriptions of the above embodiments are merely illustrative in all respects and are not limiting. It is obvious to those skilled in the art that variations and modifications can be made as appropriate. For example, configurations according to different embodiments may be partially exchanged or combined. The scope of the present invention is determined in view of the appended claims. Furthermore, equivalents to the appended claims and all modifications of the present invention which fall within the scope of the present invention are intended to be encompassed in the scope of the present invention.

REFERENCE SIGNS LIST

C1, C2, C3, Cs1, Cs2, Cs3, and Cg capacitor
Ca capacitor
HB high-band locus
HBP high-band signal port
L1, L2, and L3 coil
La and Lb inductor
Lg inductor
LB low-band locus
LNA low-noise amplifier
Ls1, Ls2, Cs1, and Cs2 reactance element
P1 first port
P2 second port
P3 third port
PA power amplifier
Pr reception signal output port
Pt transmission signal input port
Ra resistor
SW1 and SW2 switch
TERM1 and TERM2 terminating resistor
10 circulator
11 ferrite plate
20 transmission filter
30 reception filter
40 high pass filter
100 antenna
101 to 104 front end circuit
111 RFIC
112 baseband IC
113 application processor
114 I/O device
201 communication apparatus

The invention claimed is:

1. A front end circuit comprising:
a circulator comprising:
a first port into which a transmission signal is input;
a second port into which a reception signal is input and from which the transmission signal is output; and
a third port from which the reception signal is output, wherein
the second port is connected to an antenna,
an impedance of the second port is a complex conjugate of an impedance of the antenna, and
the impedance of the second port is different than an impedance of the first port and an impedance of the third port;
an antenna connection port connected to the antenna;
a reactance element connected in series between the second port and the antenna connection port; and
a first switch between the second port and the reactance element, and a second switch between the reactance element and the antenna connection port, wherein the first switch and the second switch are configured to connect the second port and the antenna connection port via the reactance element or a direct connection.

2. The front end circuit according to claim 1, wherein the reactance element has a value of 10 nH, 5 nH, 20 pF, or 10 pF.

3. The front end circuit according to claim 1, wherein the reactance element comprises an inductance and variable capacitance connected in series.

4. A circulator comprising:
a first port into which a transmission signal is input;
a second port into which a reception signal is input and from which the transmission signal is output;
a third port from which the reception signal is output; and
a first coil connected to the first port, a second coil connected to the second port, and a third coil connected to the third port, wherein a number of turns of the second coil is different from a number of turns of the first coil and the third coil, wherein
the second port is connected to an antenna,
an impedance of the second port is a complex conjugate of an impedance of the antenna, and
the impedance of the second port is different than an impedance of the first port and an impedance of the third port.

5. The circulator according to claim 4, wherein the impedance of the second port is less than 50Ω.

6. The circulator according to claim 4, wherein the second coil has fewer turns than the first coil and the third coil.

7. The circulator according to claim 4, wherein the second coil has about 1.5 turns, the first coil has about 2.5 turns, and the third coil has about 2.5 turns.

8. The circulator according to claim 4, further comprising a first coil connected to the first port, a second coil connected to the second port, and a third coil connected to the third port, wherein a diameter of the second coil is different from diameters of the first coil and the third coil.

9. The circulator according to claim 8, wherein the diameter of the second coil is less than the diameter of the first coil and the diameter of the third coil.

10. The circulator according to claim 4, further comprising a first coil connected to the first port, a second coil connected to the second port, and a third coil connected to the third port, wherein a conductor pattern width of the second coil is different from conductor pattern widths of the first coil and the third coil.

11. The circulator according to claim 10, wherein the conductor pattern width of the second coil is larger than the conductor pattern widths of the first coil and the third coil.

12. A communication apparatus comprising:
the circulator according to claim 4;
an antenna connected to the circulator; and
a radio frequency integrated circuit (RFIC) connected to the circulator.

13. The circulator according to claim 4, wherein the impedance of the second port is independent of the impedance of the first port and the impedance of the third port.

14. A front end circuit comprising:
a circulator comprising:
- a first port into which a transmission signal is input;
- a second port into which a reception signal is input and from which the transmission signal is output; and
- a third port from which the reception signal is output, wherein
- the second port is connected to an antenna,
- an impedance of the second port is a complex conjugate of an impedance of the antenna, and
- the impedance of the second port is different than an impedance of the first port and an impedance of the third port;

a transmission filter that is connected to the first port and is configured to pass a transmission signal; and a reception filter that is connected to the third port and is configured to pass a reception signal.

15. The front end circuit according to claim 14, further comprising:
- a high-band signal port into which a high-band signal is input and from which a high-band signal is output, wherein the high-band signal is a signal in a frequency band higher than a frequency band of the transmission signal and the reception signal; and
- a filter that is provided between the second port and the high-band signal port and is configured to pass the high-band signal.

\* \* \* \* \*